US008921695B2

(12) United States Patent
Drane (10) Patent No.: US 8,921,695 B2
(45) Date of Patent: Dec. 30, 2014

(54) LATCHING FLOOR BOX COVER (71) Applicant: Thomas & Betts International, Inc., Wilmington, DE (US)

(72) Inventor: Mark R. Drane, Germantown, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 164 days.

(21) Appl. No.: 13/745,530

(22) Filed: Jan. 18, 2013

(65) Prior Publication Data

US 2013/0192869 A1 Aug. 1, 2013

Related U.S. Application Data (63) Continuation-in-part of application No. 12/707,485, filed on Feb. 17, 2010, now Pat. No. 8,357,852.

(60) Provisional application No. 61/153,888, filed on Feb. 19, 2009.

(51) Int. Cl.
*H05K 5/03* (2006.01)
*H02G 3/18* (2006.01)
*H02G 3/14* (2006.01)

(52) U.S. Cl.
CPC ............... *H02G 3/185* (2013.01); *H05K 5/03* (2013.01); *H02G 3/14* (2013.01)
USPC ................................ 174/66; 174/67; 439/142

(58) Field of Classification Search
USPC ................ 174/66, 67; 439/136, 142, 536; 220/241, 242; 312/328; D8/353
See application file for complete search history.

(56) References Cited

U.S. PATENT DOCUMENTS

| 3,794,956 | A | 2/1974 | Dubreuil |
| 4,096,347 | A | 6/1978 | Penczak et al. |
| 4,237,666 | A | 12/1980 | Kohaut |
| 4,264,779 | A | 4/1981 | Rhodes et al. |
| 4,511,198 | A | 4/1985 | Mitchell et al. |
| 4,551,577 | A | 11/1985 | Byrne |
| 4,721,476 | A | 1/1988 | Zeliff et al. |

(Continued)

FOREIGN PATENT DOCUMENTS

| CA | 2143662 | 1/1991 |
| CA | 2020613 | 5/1995 |

(Continued)

*Primary Examiner* — Dhirubhai R Patel
(74) *Attorney, Agent, or Firm* — Hoffmann & Baron, LLP (57) ABSTRACT

An electrical floor box cover includes a frame having a lower surface disposable on a flooring surface and a beveled upper surface. The frame defines an access opening to permit access to an electrical box. A lid is securable to the frame and movable between a fully open position in which the access opening is substantially uncovered and a closed position. A lid lifting device is disposed between the lid and the frame, the lid lifting device urging the lid away from the closed position. A latch is disposed on the frame and includes an actuating member movable by a user between a latched and unlatched position without the use of a tool. When the actuating member is moved to the unlatched position, the lid lifting device lifts at least a portion of the lid above the frame to an initial open position wherein the lid substantially covers the access opening. Movement of the lid by the user from the initial open position to the fully open position is unassisted by the lid lifting device.

23 Claims, 11 Drawing Sheets

(56) References Cited

U.S. PATENT DOCUMENTS

| | | | |
|---|---|---|---|
| 4,984,982 A | 1/1991 | Brownlie et al. | |
| 5,023,396 A | 6/1991 | Bartee et al. | |
| 5,122,069 A | 6/1992 | Brownlie et al. | |
| 5,361,541 A | 11/1994 | Szyjkowski | |
| 5,422,434 A | 6/1995 | Wuertz et al. | |
| 5,804,764 A * | 9/1998 | Gretz | 174/53 |
| 5,888,078 A | 3/1999 | Lecreux et al. | |
| 5,954,525 A | 9/1999 | Siegal et al. | |
| 6,179,634 B1 | 1/2001 | Hull et al. | |
| 6,239,368 B1 * | 5/2001 | Gretz | 174/57 |
| 6,265,662 B1 | 7/2001 | Riedy et al. | |
| 6,290,518 B1 * | 9/2001 | Byrne | 439/131 |
| 6,417,446 B1 | 7/2002 | Whitehead | |
| 6,527,566 B1 | 3/2003 | Lambiaso | |
| 6,604,798 B1 * | 8/2003 | Cooney | 312/223.1 |
| 6,618,996 B1 | 9/2003 | Szyjkowski | |
| 6,774,304 B1 * | 8/2004 | Gretz | 174/50 |
| 6,820,364 B1 | 11/2004 | Tyson | |
| 6,840,785 B2 | 1/2005 | Drane | |
| 6,843,669 B2 | 1/2005 | Drane et al. | |
| 7,078,616 B2 | 7/2006 | Roesch et al. | |
| 7,082,729 B2 | 8/2006 | Cole et al. | |
| 7,105,745 B2 | 9/2006 | Drane et al. | |
| 7,166,798 B2 | 1/2007 | Cole | |
| 7,183,503 B2 | 2/2007 | Bowman et al. | |
| 7,243,816 B2 | 7/2007 | Aochi | |
| 7,271,351 B2 | 9/2007 | Drane | |
| 7,276,662 B2 | 10/2007 | Drane | |
| 7,319,193 B2 | 1/2008 | Halterman | |
| 7,626,120 B1 | 12/2009 | Golden et al. | |
| 8,013,242 B1 | 9/2011 | Thibault et al. | |
| 8,052,008 B2 | 11/2011 | Drane et al. | |
| 8,119,912 B2 | 2/2012 | Thibault et al. | |
| 2006/0278422 A1 | 12/2006 | Drane | |
| 2010/0206603 A1 | 8/2010 | Drane | |

FOREIGN PATENT DOCUMENTS

| | | |
|---|---|---|
| CA | 2550555 | 12/2006 |
| DE | 69026000 | 9/1996 |
| DE | 69031574 | 2/1998 |
| EP | 0410588 | 1/1991 |
| EP | 0648001 | 4/1995 |
| JP | 3-60316 | 3/1991 |

* cited by examiner

LATCHING FLOOR BOX COVER

This application in a continuation-in-part of U.S. patent application Ser. No. 12/707,485 filed on Feb. 17, 2010 which claims the benefit of priority to U.S. Provisional Patent Application Ser. No. 61/153,888 filed on Feb. 19, 2009. Both of the aforementioned applications are incorporated by reference herein in their entirety for all purposes.

FIELD OF THE INVENTION

The present invention relates to a floor box cover, and more particularly, to an electrical floor box cover having a lid which is selectively latchable in a closed position.

BACKGROUND OF THE INVENTION

The use of an electrical junction or outlet box to accommodate electrical cable terminations is well known in the art. These boxes typically house electrical components, such as electrical receptacles, jacks, plugs and other devices. The electrical box permits the electrical cables to connect to the electrical components housed inside the box. In certain applications, these electrical boxes are used in floor installations, and are referred to as floor boxes.

When an electrical box is positioned in the floor, it is typically provided with a cover in order to protect the electrical components disposed within the box. The cover typically includes a lid which may be moved between an open and closed position in order to selectively permit access to the electrical components. The lids may be secured in the closed position in order to prevent them from being inadvertently opened. Typically, the lid is retained in the closed position by a latch that is activated through the use of a tool such as a screwdriver. For example, the latching member may include a rotating latch which rotates between an open and closed position, thereby selectively securing and releasing the lid. Once the lid is unlatched, the tool is also typically needed to pry the lid to the open position.

Since a tool is needed to open the lid, this creates an inconvenience and requires a user to go through additional steps and secure additional equipment in order to simply open the lid and, for example, insert a plug in the receptacle. The tool must also be available at the time the lid is to be secured in the closed position.

In addition, electrical floor box covers are typically designed to have a relatively low profile in order to avoid tripping hazards. This is especially problematic when the lid is in the open position to permit a plug to extend from an electrical component and out of the cover. Lids in the open position typically extend upwardly from the base of the cover. This creates an increased tripping hazard while the electrical box is in use.

Accordingly, it would be desirable to provide an electrical box cover which may be opened and closed without the need for tools and an electrical floor box cover which maintains a low profile even in the open position.

SUMMARY OF THE INVENTION

The present invention provides an electrical box cover with a latchable lid.

The present invention further provides an electrical box cover having a lid biased away from a fully closed position.

The present invention further provides an electrical floor box cover which can be opened and closed without the need for tools.

The present invention still further provides an electrical floor box cover that includes a frame having a lower surface disposable on a flooring surface and a beveled upper surface. The frame defines an access opening to permit access to an electrical box. A lid is securable to the frame and movable between a fully open position in which the access opening is substantially uncovered and a closed position. A lid lifting device is disposed between the lid and the frame, the lid lifting device urging the lid away from the closed position. A latch is disposed on the frame and includes an actuating member movable by a user between a latched and unlatched position without the use of a tool. When the actuating member is moved to the unlatched position, the lid lifting device lifts at least a portion of the lid above the frame to an initial open position wherein the lid substantially covers the access opening. Movement of the lid by the user from the initial open position to the fully open position is unassisted by the lid lifting device.

The present invention still further provides an electrical floor box cover including a frame having a lower surface disposable on a flooring surface and an upper surface, the frame defining an access opening to permit access to an electrical box. A lid is removably securable to the frame and movable between an open and closed position. A latch is disposed on the frame and includes an actuating member movable between a latched and unlatched position without the use of a tool. A lid lifting device is disposed adjacent the latch and between the lid and the frame. The lid lifting device includes a portion extending upwardly through an opening in the frame. The lifting device urging the lid away from the closed position when the actuating member is in the unlatched position.

The present invention still further provides an electrical floor box cover including a frame having a lower surface disposable on a flooring surface and an upper surface. The frame defines an access opening to permit access to an electrical box. A lid is removably securable to the frame and movable between an open and closed position. The lid has a first lug extending from a first side and a lid securement device formed on a second lid side. A latch is disposed on the frame and includes an actuating member movable between a latched and unlatched position without the use of a tool. The first lug is engagable with the latch and the lid securement device is removably, engagable with the frame. The lid is separable from the frame upon moving the actuating member to the unlatched position to fully expose the access opening. A lid lifting device is disposed adjacent the latch and between the lid and the frame. The lid lifting device includes a portion extending upwardly through an opening in the frame. The lifting device urges the lid away from the closed position when the actuating member is in the unlatched position.

DETAILED DESCRIPTION OF THE PREFERRED EMBODIMENTS

With reference to FIGS. 1-4, the present invention includes a cover 10 for an electrical box 12. The cover 10 includes a frame 14 securable to the electrical box 12. A lid 16 is pivotally secured to the frame 14 and movable between an open and closed position. A latch 18 is disposed on the frame 14 in order to maintain the lid 16 in the closed position. In the closed position, an access opening 20 formed by frame 14 is covered Access opening 20 permits entry to the electrical box and the outlet box 12 and the electrical component housed therein. The electrical box cover 10 may be in a preferred embodiment in the form of a floor box cover. It is, however, within the contemplation of the present invention that the cover 10 may be used in other applications.

Figure 4:
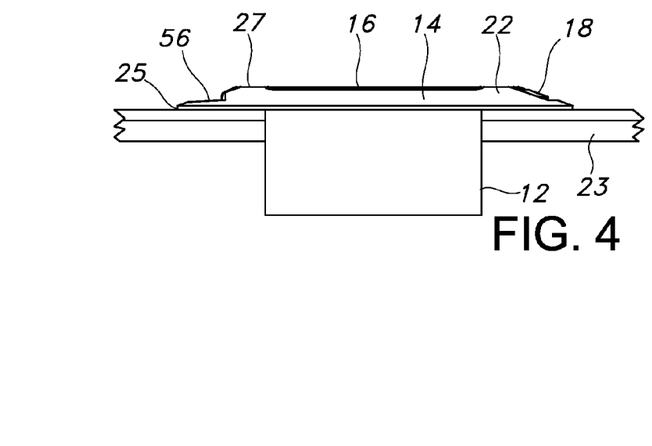
FIG. 4 is a side elevational view of the floor box cover of FIG. 1 shown installed on an electrical box.

Frame 14 may be in the form of a generally annular member; however, it is within the contemplation of the present invention that the frame could be formed of various configurations. Frame 14 may include a beveled upper surface 22 having a top 27. The upper surface 22 tapers as the frame extends toward its outer periphery as shown in FIG. 4. Beveled upper surface 22 provides a smooth transition between a flooring surface 23 and the outlet box cover 10. Frame 14 may have a bottom surface 25 which sits upon a flooring surface 23.

Figure 3:
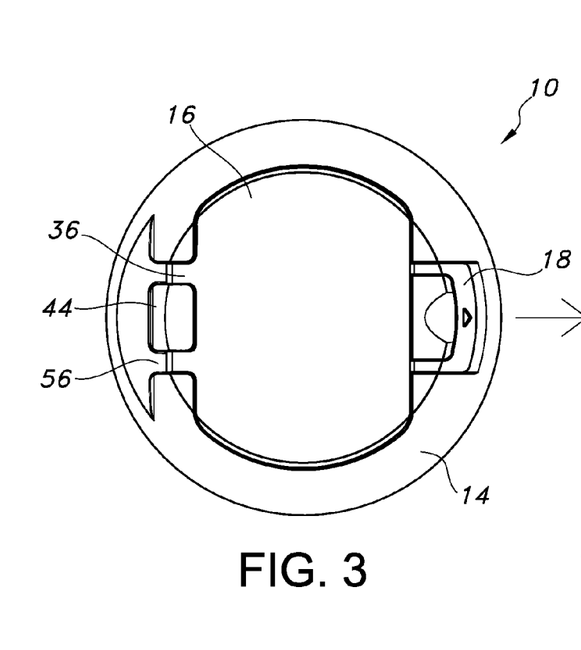
FIG. 3 is a top plan view of the outlet box cover of FIG. 1.
Figures 5, 6:
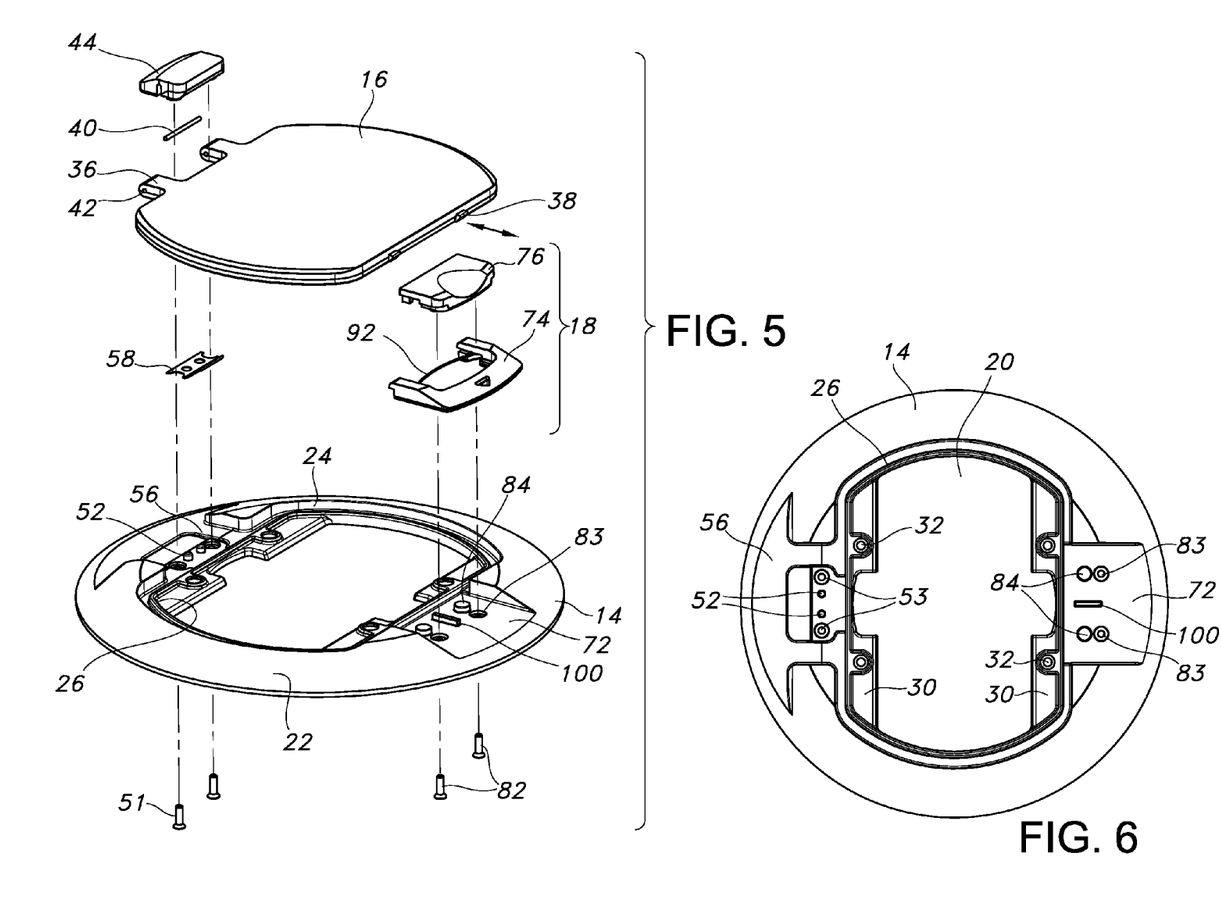
FIG. 5 is an exploded perspective view of the cover of FIG. 1.
FIG. 6 is a top plan view of a frame of the cover.
Figure 7A:
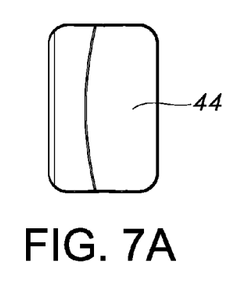
FIG. 7A is a top plan view of a retainer of the present invention.
Figure 7B:
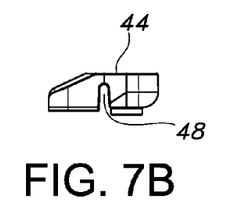
FIG. 7B is a side view of the retainer of FIG. 7A.
Figure 7C:
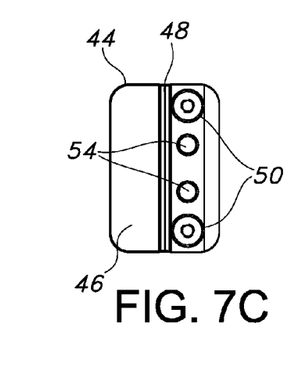
FIG. 7C is a bottom plan view of the retainer of FIG. 7A.
Figure 8A:
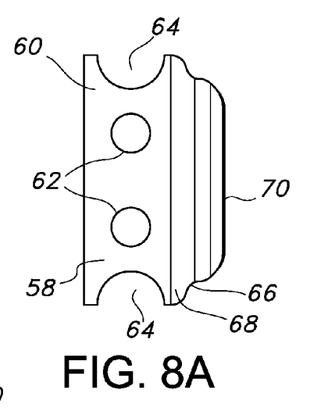
FIG. 8A is a top plan view of a lid biasing device.
Figure 8B:
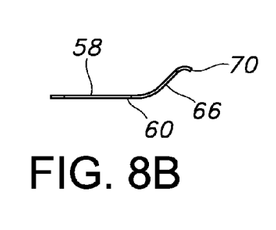
FIG. 8B is a side elevational view of the lid biasing device.
Figure 9A:
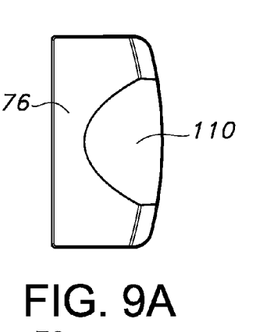
FIG. 9A is a top plan view of a latch retainer
Figures 9B, 9C:
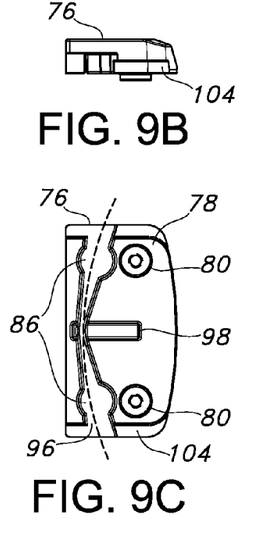
FIG. 9B is a side elevational view of the latch retainer.
FIG. 9C is a bottom plan view of the latch retainer.
Figure 13:
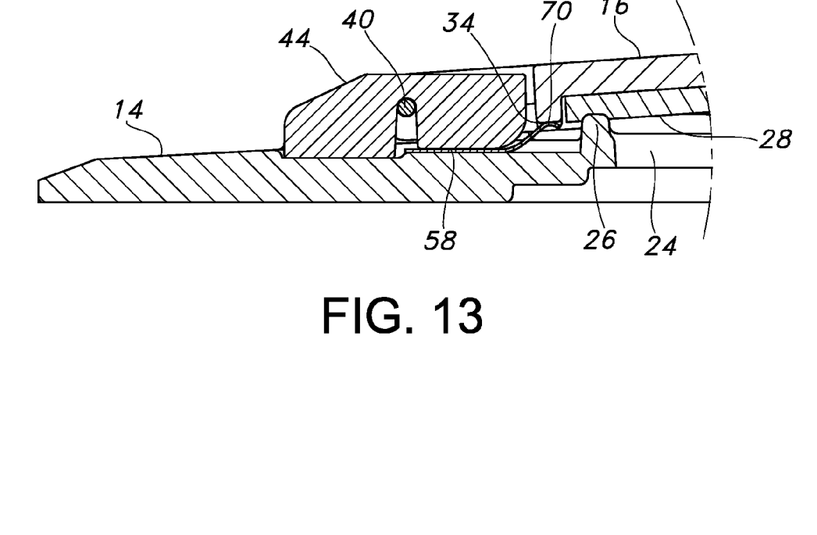
FIG. 13 is a detailed view of the hinge section of FIG. 12.

With additional reference to FIGS. 5 and 6, the frame 14 may include a lid recess 24 surrounding the access opening 20. The recess 24 may be dimensioned to receive lid 16 when in a closed position as shown in FIGS. 3 and 4. When the lid 16 is in the closed position, it preferably does not extend above the frame 14. The recess 24 may include an upstanding wall-like rib 26 which at least partially bounds the access opening 20. In a preferred embodiment, the rib 26 may completely surround the access opening 20. The rib 26 may interact and engage a gasket 28 disposed on the undersurface of lid 16 as shown in FIG. 13. Engagement between the gasket 28 and the rib 26 helps provide a water-resistant feature to the cover 10. A plurality of tabs 30 may extend inwardly from the rib 26 toward the opening 20. Tabs 30 may include apertures 32 that permit fasteners (not shown) to secure the electrical box 12 to the cover frame 14.

Lid 16 may include a general planar member having an undersurface 34 including a channel 35 for receiving gasket 28. The lid 16 may include a pair of spaced protruding hinge members 36 extending from one edge thereof. Hinge members 36 permit pivotal mounting between the lid 16 and the frame 14. With specific reference to FIG. 5, the lid 16 may further include a pair of spaced lugs 38 extending from a side opposite to the side from which the hinge members 36 extend. The lugs 38 may engage a latch 18 in order to maintain the lid 16 in the closed position.

Lid 16 may be pivotally secured to the frame 14 by a hinge pin 40 which extends into and between the hinge members 36. Hinge members 36 may include openings 42 in order to allow the pin 40 to be slid therein. The pin 40 is held on the frame 14 by a lid retainer 44. With reference to FIGS. 5 and 7A-C, lid retainer 44 extends over the hinge pin 40 and is secured to the frame 14. The lid retainer 44 may include an undersurface 46 having a longitudinally extending slot 48 for receiving the hinge pin 40. A pair of threaded openings 50 may also be formed on the undersurface of the lid retainer in order to permit threaded fasteners 51 (FIG. 5) to extend through openings 53 in the frame and into the retainer 44 thereby securing the retainer to the frame 14. The frame 14 may include a pair of alignment pins 52 which mate with a pair of blind holes 54 formed in the lid retainer undersurface 46 in order to properly align the lid retainer 44 with respect to the frame. Frame 14 may include a hinge relief 56 for receiving the hinge pin 40, the lid retainer 44, and the lid hinge members 36. Hinge relief 56 extends outwardly beyond the lid retainer 44 toward the perimeter of the frame 14. The hinge relief 56 permits the lid retainer 44 to be flush with the top 27 of the upper surface.

Figure 2:
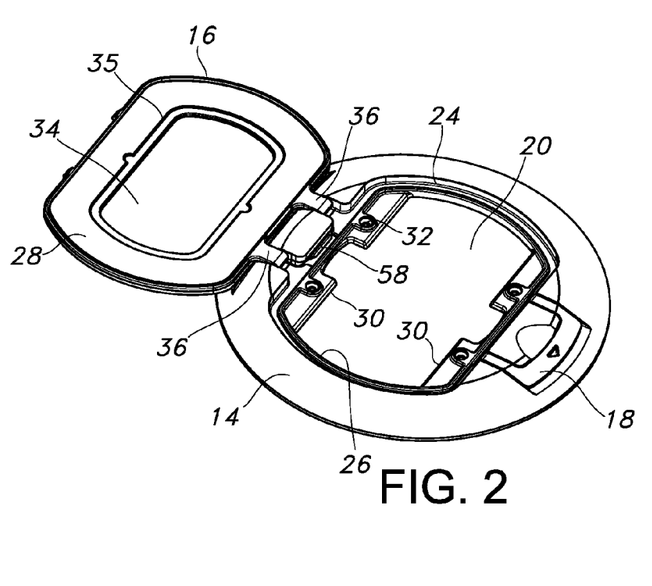
FIG. 2 is a top perspective view of the floor box cover of FIG. 1 showing the lid in the fully open position.

As shown in FIG. 2, the hinge relief 56 further permits the lid 16 to be rotated approximately 180 degrees from the closed position to the fully open position so that it essentially lies flat when in the fully open position, thereby reducing the risk of tripping over an open lid. The relief 56 is configured to receive the hinge members 36 as well as a portion of the lid adjacent the hinge members 36.

With reference to FIGS. 5, 8A-8B and 12-13, cover 10 may also include a biasing device 58 which tends to urge the lid 16 upwardly from the fully closed position. The biasing device 58 may include a spring member formed of a flat sheet of spring steel which is disposed between the lid retainer 44 and the frame 14. The biasing device 58 may include a base 60 including a pair of holes 62 extending there-through which is sized to receive the alignment pins 52 extending from the frame 14 (FIGS. 5 and 6). The ends of the base may include semicircular cutouts 64 in order to permit the fastening members 51 securing the lid retainer 44 to the frame 14 to pass there-through. Accordingly, when the lid retainer 44 is secured to the frame 14, the biasing device 58 is also secured. The biasing device 58 includes a member 66 extending generally upwardly on an incline from a base side edge 68. This upward extending member terminates in a generally rounded lip 70. The member 66 and lip 70 extend from under the lid retainer 44 toward the lid 16 as shown in FIG. 13. The lip 70 is positioned such that it engages the lid undersurface 34 when the lid 16 approaches the closed position. The biasing device 58 acts on a portion of said lid adjacent to a pivotal connection between the lid 16 and the frame 14.

Figure 1:
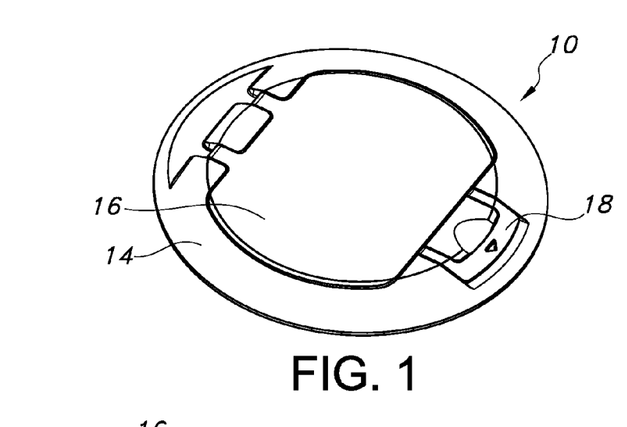
FIG. 1 is a top perspective view of the floor box cover of the present invention showing a lid in the closed position.
Figure 12:
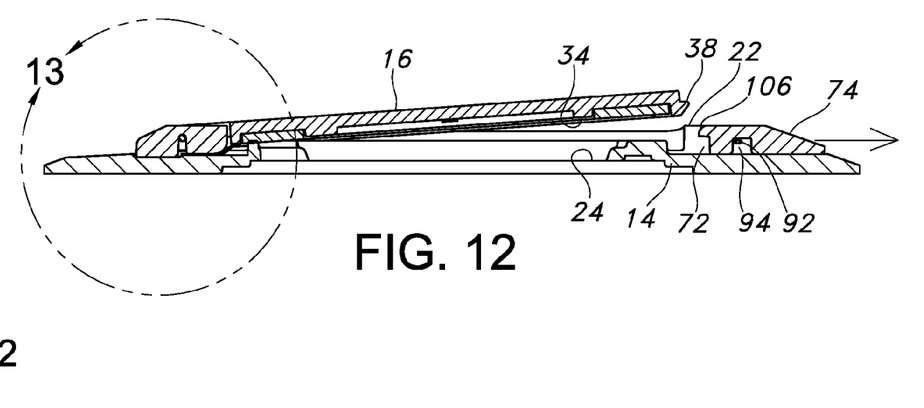
FIG. 12 is a side cross-sectional view taken along line 12-12 of FIG. 11 showing the cover in an initial partially open position.

In order to move the lid 16 to the fully closed position wherein the lid fully sits within recess 24, the lid 16 must be urged against the force of the biasing device 58. If the lid 16 is released, the biasing device 58 pivots the lid to an initial opened positioned as shown in FIG. 12. In the initial partially opened position, the lid 16 rests on the biasing device lip 70 and the lid substantially overlies the access opening 20. The lid 16 will remain in that position until a user either further rotates the lid 16 to the fully open position, as shown in FIG. 2, thereby uncovering the access opening 20, or pushes the lid to the fully closed position where it engages the latch 18 and is retained thereby as shown in FIG. 1.

The thin configuration of biasing device 58 allows it to be easily installed between the frame and the lid without requiring excessive space for installation or adding unnecessary thickness to the cover. This is especially important to floor box covers wherein a minimal amount of protrusion above the floor surface is desired.

With reference to FIGS. 5, 6, and 9A through 10C, the lid 16 is retained in the fully closed position against the bias of the biasing device 58 by latch 18. The latch 18 may be disposed on the frame 14 within a latch recess 72 and be flush with the top of the frame 27 (FIG. 4). Latch 18 may include an actuating member 74, shown in FIGS. 10A-C, which is moveable by a user between a latched and unlatched position. Latch 18 may further include a latch holder 76, shown in FIGS. 9A-C, which secures the actuating member to the frame 14. Holder 76 includes a bottom surface 78 having a pair of threaded openings 80 configured to receive fastening hardware 82 (FIG. 5) which secures the holder 76 to the frame 14. Clearance apertures 83 extend through the frame 14 to permit the fastening hardware 82 to extend there-through and engage the threaded openings 80. A pair of bosses 84 extends upwardly from the base of the latch recess 72 and may be inserted in relief holes 86 formed in the latch holder bottom surface 78.

Figure 10A:
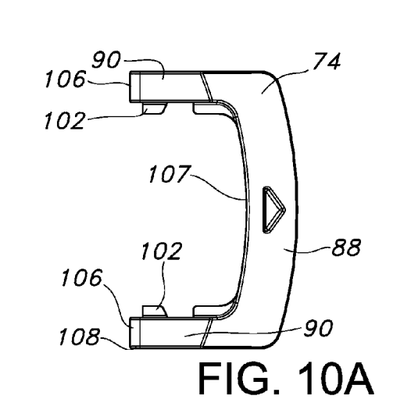
FIG. 10A is a top plan view of a latch actuating member.
Figure 10B:
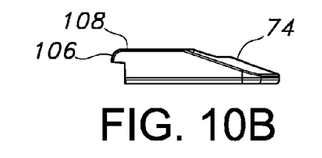
FIG. 10B is a side elevational view of the latch actuating member.
Figure 10C:
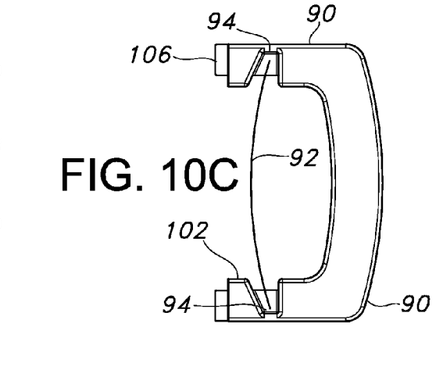
FIG. 10C is a bottom plan view of the latch actuating member.

The actuating member 74 is a generally C-shaped device having a central portion 88 with two legs 90 extending from ends of the central portion 88. A biasing member in the form of a spring wire 92 is secured at its ends to the legs 90. The legs 90 may include in their bottom surfaces notches 94 for receiving the ends of the spring wire 92. The spring wire 92 may be bowed in the middle when positioned within the actuating member 74.

Latch holder 76 covers the spring wire 92 and retains the actuating member on the frame 14. The latch holder bottom surface 78 includes a curved groove 96 in which a portion of the spring wire 92 sits. The groove 96 has a width that widens as the groove extends away from the middle of the latch retainer. The bottom surface 78 further includes a medially disposed elongate slot 98. Slot 98 extends into and across groove 96. Slot 98 is configured to receive a protrusion 100 (FIG. 5) extending upwardly from the base of the latch recess between the two bosses 84. When the latch holder 76 is secured to the frame, the protrusion extends into the slot 98 and supports the portion of the spring wire 92 within the groove 96. Bosses 84 extend into recesses 101 and also support the spring wire 92 within the groove 96. With the spring wire 92 retained within the groove 96, the actuating member 74 may be urged in a sliding manner outwardly to an unlatched position away from the access opening 20, thereby flexing the spring wire 92. When the actuating member 74 is released, the wire 92 returns to an initial pre-flexed state and actuating member 74 is moved back toward the access opening 20 and a latched position.

The actuating member 74 may be guided in its movement between the latched and unlatched position. Guidance is provided by the cooperation of tabs 102 projecting from the actuating member legs 90 toward each other and undercuts 104 formed on the side edges of the latch retainer 76. Tabs 102 slide in a guided manner within the space provided by the undercuts 104.

Figure 14:
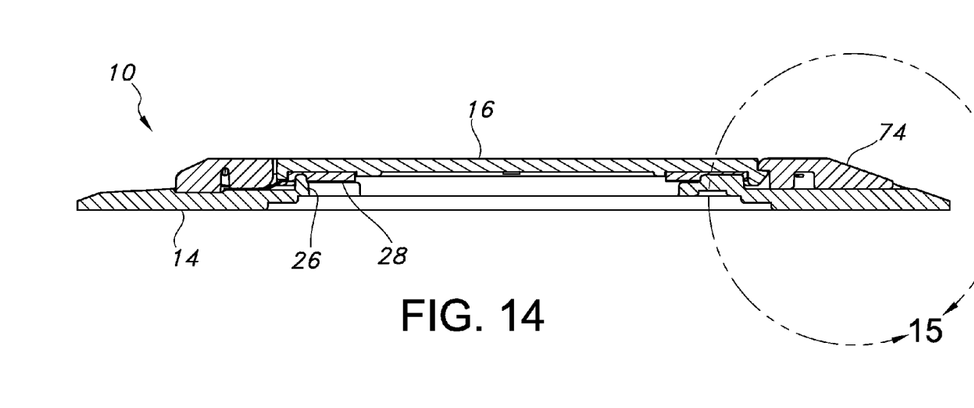
FIG. 14 is a cross-sectional view of the cover showing the lid in the closed and latched position.
Figure 15:
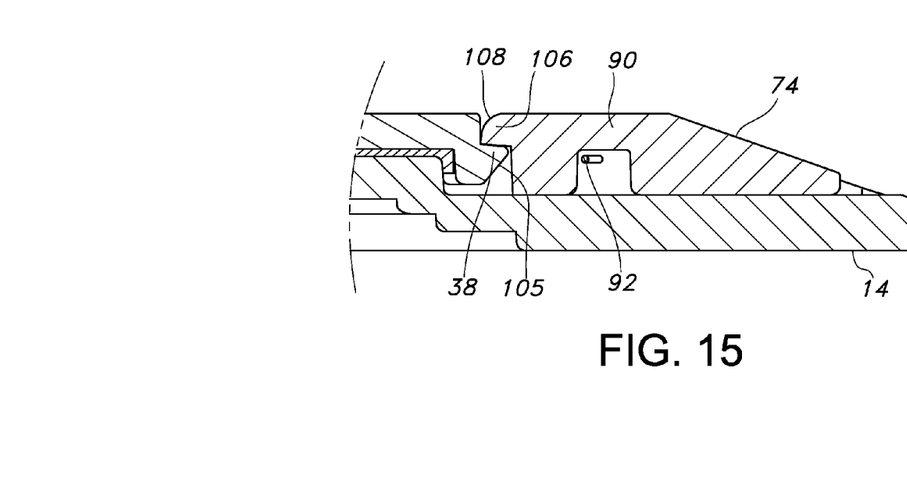
FIG. 15 is a detail view of the latch of FIG. 14

With reference to FIGS. 14 and 15, when the lid 16 is moved to the fully closed position, the actuating member 74 engages the lid 16 and retains it in that position. This is achieved through an engagement between catches 106, disposed on the ends of the legs 90, and the lugs 38 projecting from the side of the lid. The catches 106 may have a rounded upper surface 108 and the lugs 38 may have a tapered surface 105. Accordingly, when the lugs 38 engage the catches from the top, as when closing the lid, the actuation member 74 is moved toward the unlatched position such that the lugs 38 can slip beneath the catches 106. Once in that fully closed position, the actuating member catches 106 will move back into position above the lid lugs 38 thereby retaining the lid 16 in the fully closed position shown in FIGS. 1 and 4. Accordingly, the lid 16 can be locked in the fully closed position without the use of any tools.

Figure 11:
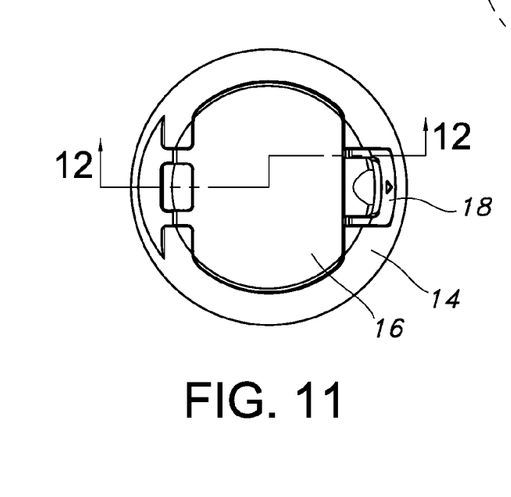
FIG. 11 is a top plan view of a cover showing the latch actuating member in the open position.

The top surface of the latch holder 76 may include a concave portion 110 (FIG. 9A) to allow a user to engage a generally vertically oriented surface 107 (FIG. 10A) of the actuating member 74 with their finger. Upon such engagement, the actuating member 74 may be pulled away from the lid 16 to the unlatched position. In this unlatched position, the catches 106 are moved clear of the lid lugs 38 and the lid 16, under the force of the biasing device 58, partially pops open. (FIGS. 11 and 12). At least a portion of the lid undersurface 34 is raised above the frame upper surface 22, and therefore, a user may easily grab the partially open lid 16 and rotate it to the fully open position shown in FIG. 2. Accordingly, a user can unlatch and open the lid 16 without the need for tools. In this way, a user can easily access the outlet box and any receptacle secured therein.

The latch 18, with its related components, is mounted entirely on the upper surface of the frame within the latch relief 72. In addition, the only openings in the frame used to accommodate the latch are the clearance apertures 83. However, they are filled with fastening hardware 82, thereby, resisting water intrusion through the latch.

In operation, when a user desires to open the cover, the actuating member 74 is pulled back to the unlatched position. The biasing device 58 rotates the lid 16 such that at least a portion of the lid is raised above the frame top 27. The lid 17 then assumes the initial open position where it is unlatched, but still covers the access opening 20. The biasing device 58 only acts over a relatively small amount of the lid's rotation; therefore, unlatching the lid causes the lid to raise a relatively small degree. To fully open the cover, a user may engage a portion of the lid 16 protruding above the frame and rotate the lid 16 to the fully open position.

With reference to FIGS. 16-24 an alternative embodiment of the outlet box cover is shown. Cover 200 is similar to the embodiment of cover 10 set forth above. The distinctions between the embodiments will be set forth in detail herein. Cover 200 includes a frame 204 securable to an electrical box. A lid 206 is securable to the frame 204 and movable between an open and closed position. The frame and lid may be formed of metal or a plastic material of the type used for electrical box covers.

A latch 208 is disposed on the frame 204 in order to maintain the lid 206 in the closed position. In the closed position, an access opening 210 formed by frame 204 is covered Access opening 210 permits entry to the electrical box and electrical component housed therein. The electrical box cover 200 may be in a preferred embodiment in the form of a floor box cover. However, it is within the contemplation of the present invention that the cover 200 may be used in other applications.

Frame 204 may be in the form of a generally annular member; however, it is within the contemplation of the present invention that the frame could be formed of various configurations. Frame 204 may include a beveled upper surface 212 having a top 217. Beveled upper surface 22 provides a smooth transition between a flooring surface 213 and the outlet box cover 10. Frame 204 may have a bottom surface 215 which sits upon a flooring surface. Frame 204 may be formed of plastic or metal material.

Figures 16, 16A, 17:
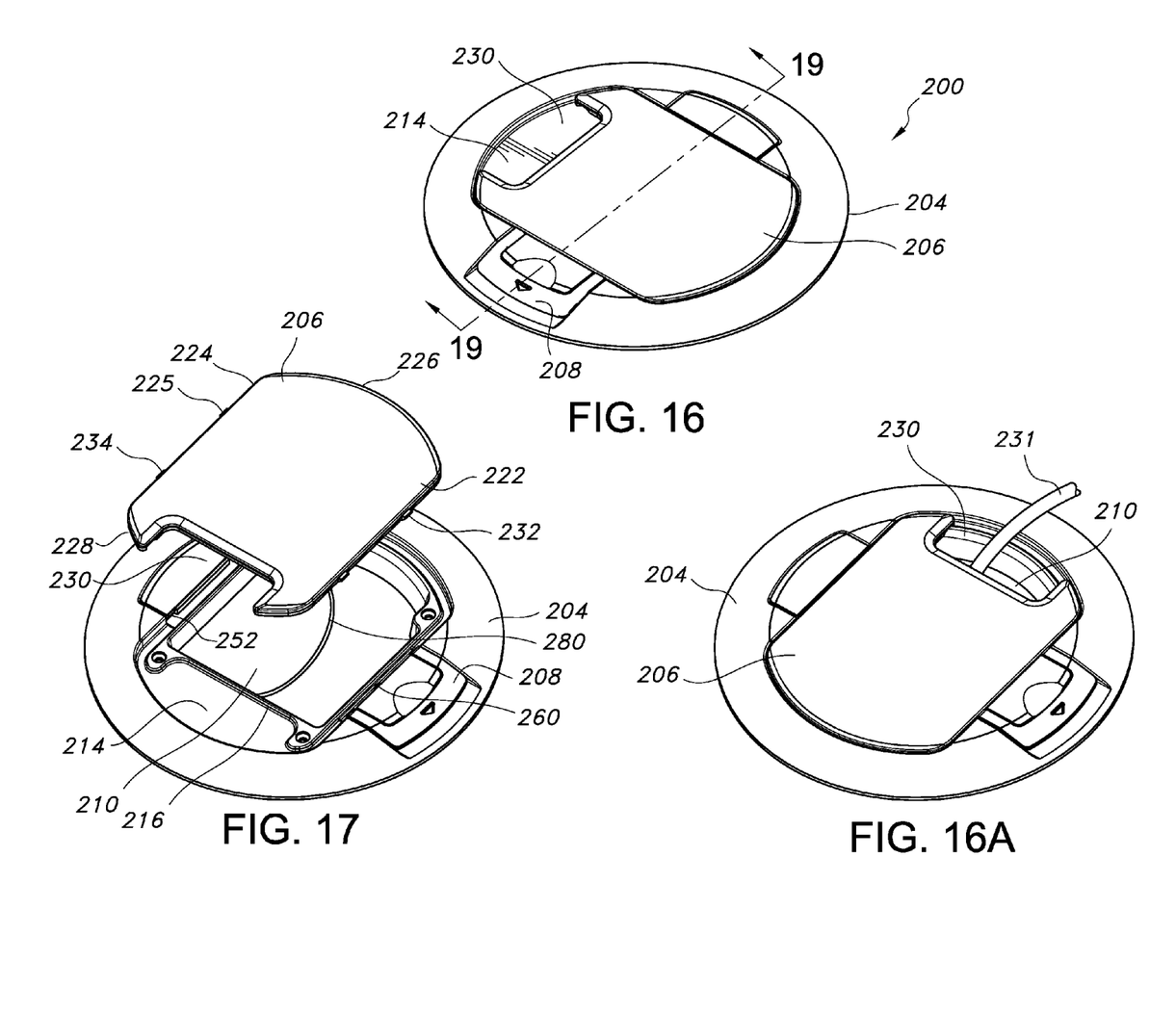
FIG. 16 is a top perspective view of an alternative embodiment of a floor box cover of the present invention showing a lid in the closed position.
FIG. 16A is a top perspective view of the floor box cover of FIG. 16 showing the lid an alternative orientation.
FIG. 17 is a top perspective view of the floor box cover with the lid in a fully open position and separated from the frame.
Figure 18:
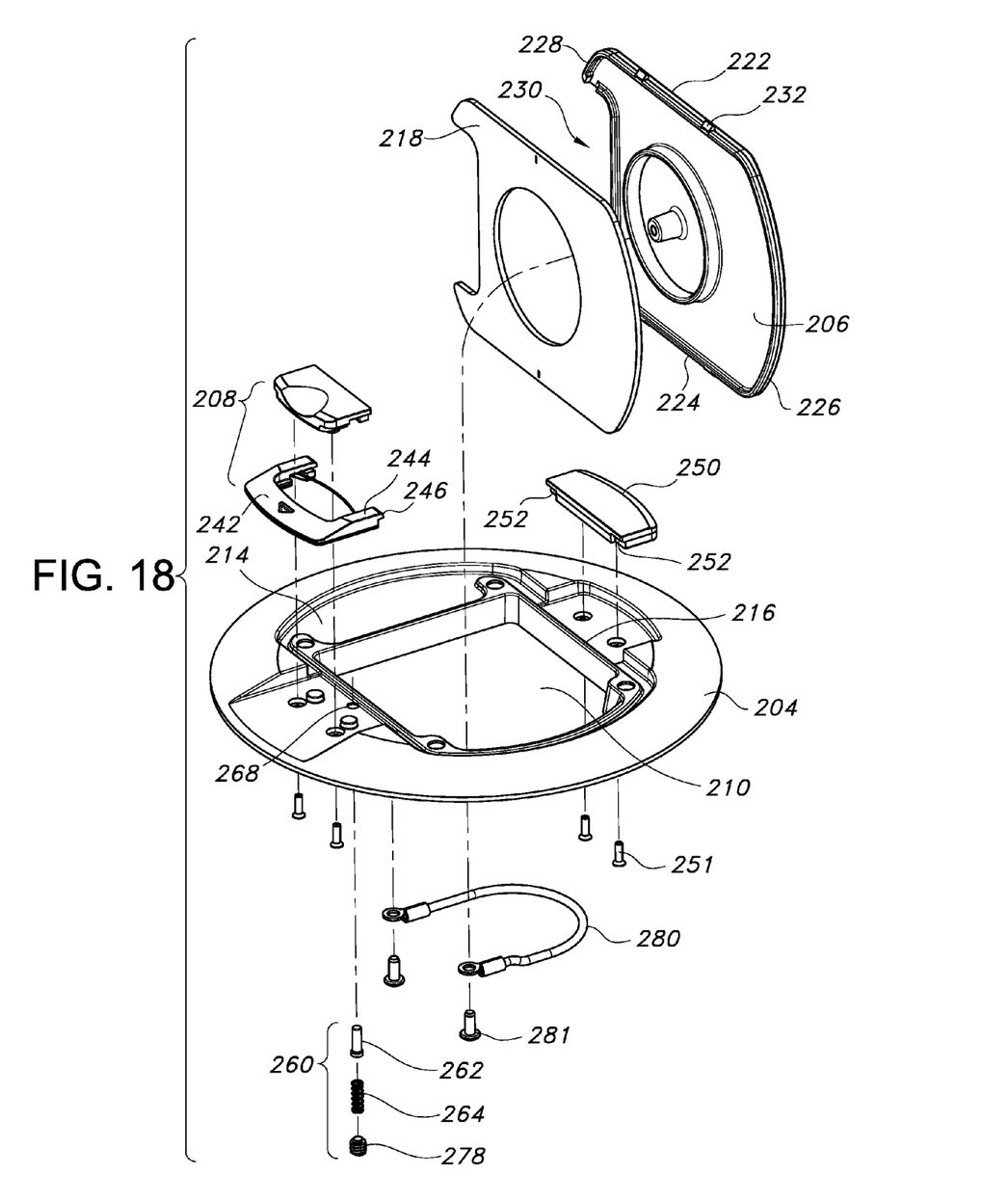
FIG. 18 is an exploded perspective view.
Figure 19:
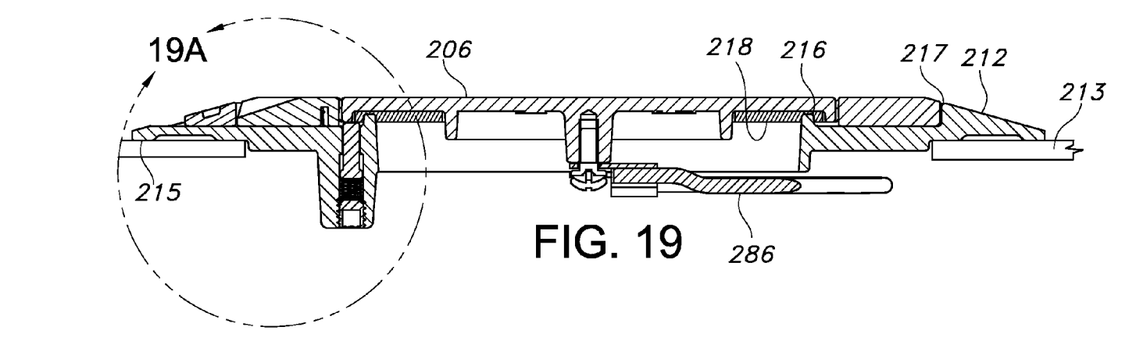
FIG. 19 is a cross-sectional view of the cover taken along line 19-19 of FIG. 16 showing the lid in a closed position.
Figure 19A:
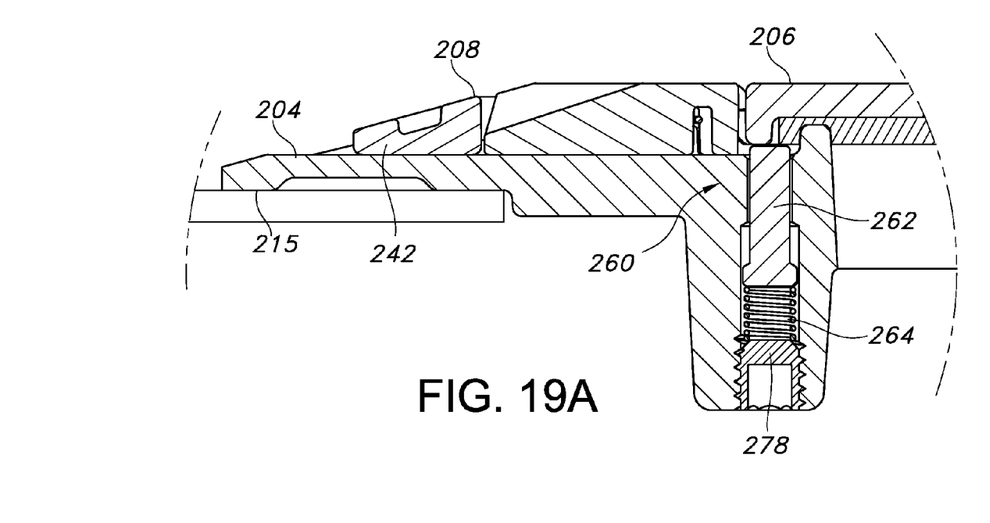
FIG. 19A is a detail view of FIG. 19.

With additional reference to FIGS. 17 and 18, the frame 204 may include a lid recess 214 surrounding the access opening 210. The recess 214 may be dimensioned to receive lid 206 when in a closed position as shown in FIGS. 16 and 19. When the lid 206 is in the closed position, it preferably does not extend above the frame top 217. The recess 214 may accommodate a gasket 218 that is engagable with the lid 206 to help provide a water-resistant feature to the cover 10. In a preferred embodiment, a rib 216 may completely surround the access opening 210. The rib 216 may engage gasket 218 disposed on the undersurface of lid 206 to help provide a water-resistant feature to the cover 200. The recess may include apertures 220 that permit fasteners (not shown) to secure the cover frame 204 to the electrical box.

Lid 206 may include a general planar member. Having two opposes linear side edges 222 and 224 joining end edges 226 and 228. End edge 226 may have a generally continuously curved configuration. End edge 228 may include a notch 230 formed therein. The lid 206 may be placed on the frame in either of two orientations. In a first orientation, the lid notch 230 may be positioned over a portion of the frame 204, thereby completely covering the access opening as shown in FIG. 16. The lid may have a second orientation which is 180 degrees offset from the first orientation. In the second orientation, as shown in FIG. 16A, the lid notch 230 extends over a portion of the access opening 210. This allows cords 231 to extend through the cover and into the outlet box when the lid 206 in in the closed position.

The lid side edges 222 and 224 may each include a pair of lid securing elements 225. In one embodiment, the lid securing elements are projecting lugs 232 and 234, respectively, as shown in FIG. 17. The lugs may be tab-like structures integrally formed with the lid. The lugs 232, 234 are used to secure the lid 206 to the frame 204 in a closed position. The frame 204 may include a latch 208 similar to latch 18 described above with regard to the embodiment shown in FIGS. 1-15. The latch 208 has an actuating member 242 with catches that selectively engages the lugs on the lid. Since the lid can be positioned in the frame in two orientations, the actuating member 242 can lockingly engage the pair of lugs 232 and 234 on either side of the lid.

Figure 20:
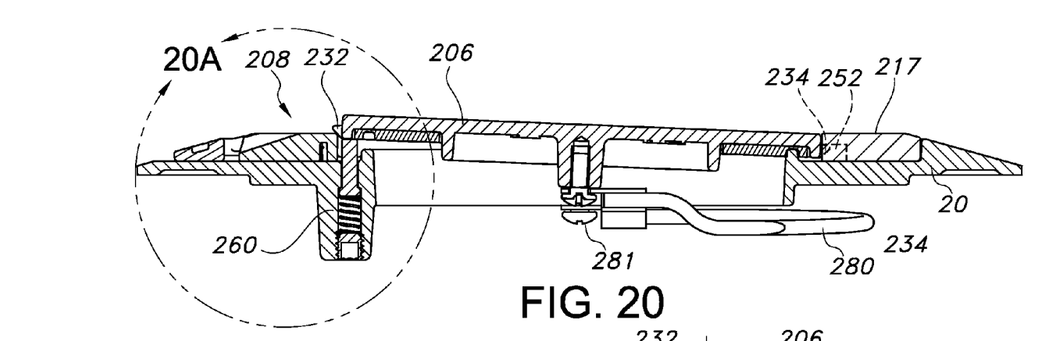
FIG. 20 is a cross-sectional view of the cover showing the lid in an initial open position.
Figure 20A:
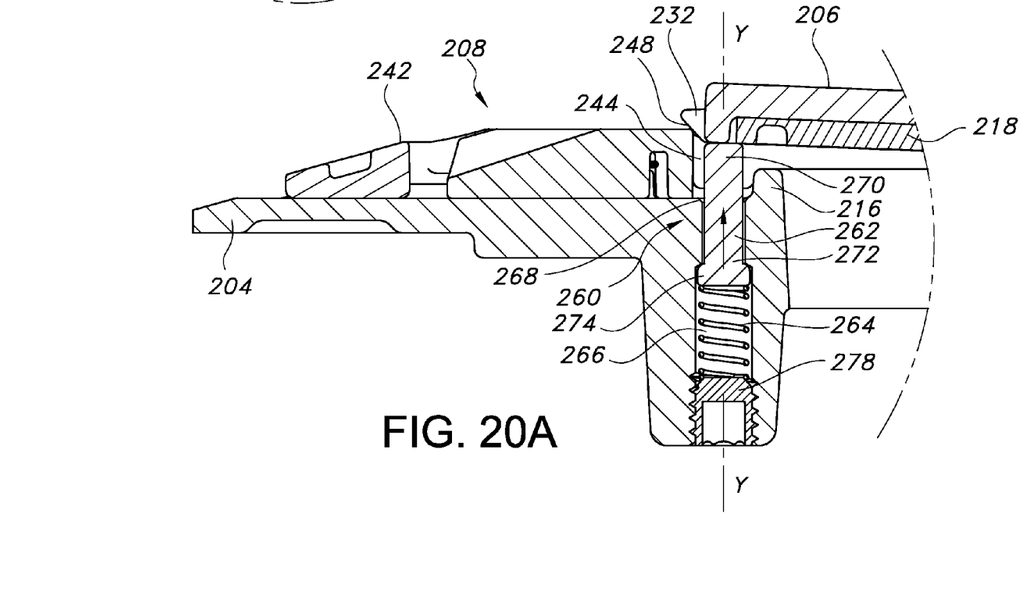
FIG. 20A is a detail view of a FIG. 20.

As in the previously described embodiment, when the lid 206 is moved to the fully closed position, the actuating member 242 engages the lid 206 and retains it in that position. This is achieved through an engagement between actuating member catches 244, and the lugs 232/234 projecting from the side of the lid which are positioned adjacent the latch. With reference to FIGS. 18 and 20A, the catches 244 may have a rounded upper surface 246 and the lugs 232/234 may have a tapered surface 248. Accordingly, when the lugs engage the catches from the top, as when closing the lid, the actuation member 242 is moved toward the unlatched position such that the lugs can slip beneath the catches 244. Once in the fully closed position, the actuating member catches 244 will move back into position above the lid lugs 232/234, thereby retaining the lid 206 in the fully closed position. Accordingly, the lid 206 can be locked in the fully closed position without the use of any tools.

With reference to FIGS. 17 and 18, the lugs 232 or 234 on the lid side opposite from the latch 208 may be inserted underneath a lid retainer 250 secured to the frame 204 with fasteners 251. Alternatively, the lid retainer could be integrally formed with the frame. The lid retainer 250 may include a pair of spaced indentations 252 to receive the lugs. It is also within the contemplation of the present invention that the lugs may be formed on the frame and the lid may have indentations formed therein for receiving the lugs. The cooperation between the lugs 232, 234 and lid retainer 250, prevent the lid from being moved upwardly with respect to the frame when the lid is in the closed position and retained by the latch 208. In this closed position, the latch holds down one side of the lid and the lid retainer holds down the opposite side of the lid. However, the cooperation between the lugs and lid retainer permits the lid 204 to be moved in a generally horizontal direction such that lugs move out from under the lid retainer when the lid is moved toward the open position. Accordingly, the cooperation between the lugs 232,234 and indentations 252 creates a securement device that helps to retain the lid 206 on the frame 204 when the lid is in the closed position but also permits the lid to be separated from the frame when the lid in in the open position.

The cover 200 may further include a lid lifting device 260 for lifting the lid from the fully closed position to an initial open position. In the initial open position shown in FIGS. 20 and 20A, the lid 206 still covers the access opening but is at least partially lifted above the top of the frame 217. The lid lifting device 260 may include a driver 262 movably retained in the frame and a biasing device 264 disposed in the frame adjacent the latch 208.

In one embodiment shown FIGS. 18-21, the driver 262 may include a pin and the biasing device 264 may include a coil spring. The frame may include a chamber 266 for accommodating the pin and spring. The chamber 266 may be a round tube-shaped structure integrally formed in the frame 204. The chamber 266 may have a vertical axis Y-Y extending between the lower and upper surface of the frame. The chamber 266 may have an opening 268 disposed in the base of the recess 214 through which the driver 262 may extend. A driver first portion 270 extends upward through the opening 268 and into the recess toward the lid under the force of the biasing device 264. A driver second portion 272 may have an annularly protruding head 274 that remains captured in the chamber 266. The chamber 266 may have a bottom aperture 276 that permits the driver 262 and biasing device 264 to be placed therein. The aperture 276 may be closed by a plug 278 that may include with a set screw or similar fastener or other plug-like material.

The driver 262 under the force of the biasing device 264 provides an upward force to move the lid 206 from the fully closed position to the initial open position. When the latch 208 is moved to the unlatched position, the driver 262 pushes up on the lid side edge 222 to raise a portion thereof above the frame top 217. The driver 262 tends to tilt the lid 206 such that the side of the lid adjacent the pin is raised up and the opposed lid side remains in the recess 214. In the initial open position shown in FIGS. 20 and 20A, the lugs 232 are moved above the catches, so when the actuating member is released, the lugs remain above and clear of the catches, therefore, the lid is unlocked. The driver 262 will support the lid 206 in this unlocked initial open position without any further action by the user. When a user desires to move the lid 206 to a fully open position, they may grab the portion of the lid extending above the frame 204 and pull the lid 206 away from the frame 204. This action will remove the lugs 234 from the lid retainer 250. Since the lid is no longer secured to the frame it may be completely separated from the frame. Full access to the outlet box through the uncovered access opening 210 is created. Accordingly, the lid 206 may be opened and removed from the frame 204 without the need for any tools.

Figures 21, 22:
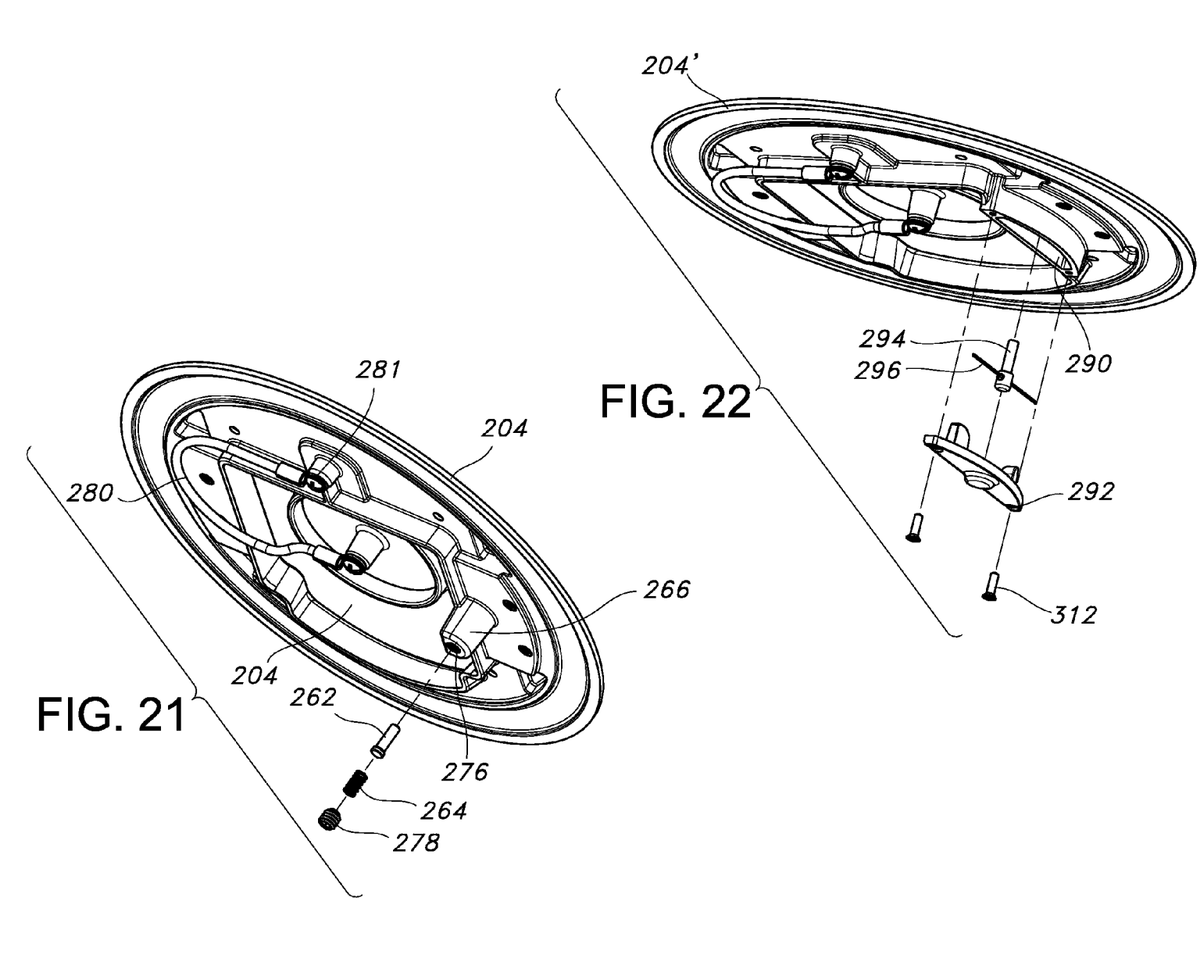
FIG. 21 is a bottom perspective view showing a lid lifting device exploded therefrom.
FIG. 22 is a bottom perspective view showing an alternative embodiment of a lid lifting device exploded therefrom.

As shown for example in FIGS. 17, 18, and 21, a thin flexible lanyard 280 may be attached to the bottom of the lid and the frame with fasteners 281. In this way when the lid 206 is separated from the frame 204 it does not get misplaced. Therefore, the lid is at hand when the user desires to secure the lid to the frame.

Figure 23:
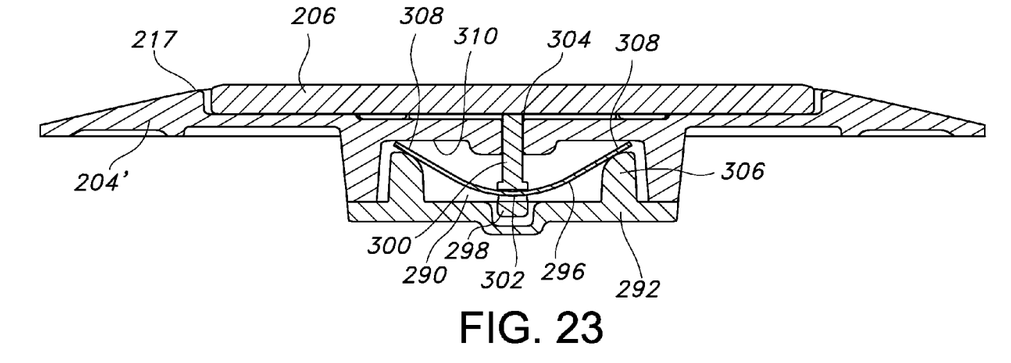
FIG. 23 is a cross-sectional view of the cover of FIG. 22 showing the lid in a closed position.
Figure 24:
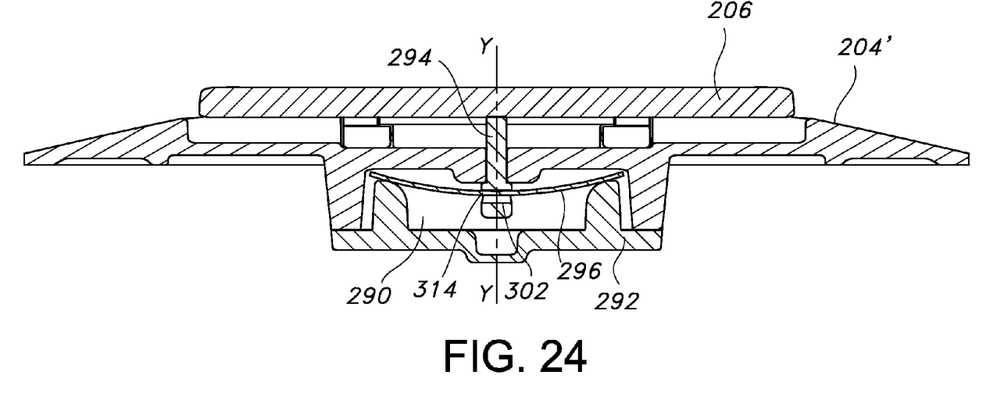
FIG. 24 is a cross-sectional view of the cover of FIG. 22 showing the lid in an initial open position.

An alternative embodiment of a lid lifting device is shown in FIGS. 22-24. The undersurface of the frame 204' may include a chamber 290 on a lower frame surface enclosed by a cap 292. The chamber 290 may be integrally formed with the frame 204'. In this embodiment, the chamber 290 may have a generally D-shaped cross-section, although other shapes may be used. A driver 294 and biasing device 296 may be disposed in the chamber 290. The driver 294 may include a pin and the biasing device may include a wire spring. The pin may have a head 298 and a body 300 extending outwardly therefrom. The head 298 has a diameter greater than the body 300. The head 298 includes an aperture 302 extending there through. The wire spring 296 extends through the head aperture 302. The wire spring may have a generally straight configuration when in an unstressed state. The pin body 300 extends through an opening 304 disposed in the frame recess in a manner similar to the embodiment described above.

The upper surface of the cap 292 may include spaced raised projections 306. The ends of the wire spring 308 are retained between the raised projections 306 and the top wall of the chamber 310. The cap 292 may be retained to the frame by one or more fasteners 312. With the ends of the wire spring retained, a spring medial portion 314 is free to flex within the chamber. Accordingly, the pin 294 may move in a generally vertical direction along axis Y-Y under the bias of the wire spring 296. The wire spring 296 urges the pin 294 out through the opening 304 and into engagement with the lid edge. Therefore, as in the previously described embodiment, the pin 294 lifts the lid 206 and supports it above the frame 204 as shown in FIG. 24. When the lid 206 is in the fully closed and latched position, the pin is depressed downwardly bowing the wire spring as shown in FIG. 23. In the fully closed position, the latch actuating member will engage the lugs to retain the lid in the closed position.

When the actuating member is moved to the unlatched position, the pin biased by the wire spring lifts the edge of the lid up allowing a user to remove the lid 206 from the frame 204 to fully expose the access opening 210. The user then has full access to the electrical box within.

Although preferred embodiments of the present invention have been described herein with reference to the accompanying drawings, it is to be understood that the invention is not limited to those precise embodiments and that various other changes and modifications may be affected herein by one skilled in the art without departing from the scope or spirit of the invention, and that it is intended to claim all such changes and modifications that fall within the scope of the invention.

What is claimed is:

1. An electrical floor box cover comprising:
   a frame having a lower surface disposable on a flooring surface and a beveled upper surface, the frame defining an access opening to permit access to an electrical box;
   a lid securable to the frame and movable between a fully open position and a closed position, the access opening being substantially uncovered when the is in the fully open position;
   a lid lifting device disposed between the lid and the frame, the lid lifting device urging the lid away from the closed position, the lid lifting device including a driver movably retained in the frame and a biasing device acting on the driver to urge the driver toward the lid; and
   a latch disposed on the frame and including an actuating member movable by a user between a latched and unlatched position without the use of a tool, wherein when the actuating member is moved to the unlatched position, the lid lifting device lifts at least a portion of the lid above the frame to an initial open position when the biasing device urges the drive toward the lid, wherein the lid substantially covers the access opening, the lid lifting device supporting the lid in the initial open position, and wherein movement of the lid by the user from the initial open position to the fully open position is unassisted by the lid lifting device.

2. The floor box cover as defined in claim 1, wherein the biasing device includes a coil spring disposed between the frame and the driver.

3. The floor box cover as defined in claim 1, wherein the frame includes a recess for receiving therein the lid, and the driver extends into the recess.

4. The floor box cover as defined in claim 1, wherein the frame includes a chamber and the driver and the biasing device are disposed therein, the driver including a first portion extendable out of the chamber and into contact with the lid, the driver including a second portion retained in the chamber.

5. The floor box cover as defined in claim 4, wherein the driver includes a pin, and the biasing device includes a coil spring.

6. The floor box cover as defined in claim 1, wherein the lid includes a first and second opposed sides, and a first projection extends outwardly from the first side and a second projection extends outwardly from the second side.

7. The floor box cover as defined in claim 6, wherein the first projection is engagable with the latch wherein the lid is retained in the closed position when the actuating member is in the latched position.

8. The floor box cover as defined in claim 7, wherein the frame includes an indentation for receiving therein the second projection.

9. The floor box cover as defined in claim 7, wherein the first projection is disengaged from the latch when the actuating member is in the unlatched position, and wherein the lifting device raises at least a portion of the lid above a top surface of the frame.

10. The floor box cover as defined in claim 7, wherein the first side of the lid includes a plurality of projections and at least two of the plurality of projections is engaged by the latch when the actuating member is in the latched position.

11. The floor box cover as defined in claim 1, wherein the lid remains in the raised initial open position when the actuating member is released.

12. The floor box cover as defined in claim 1, wherein the biasing device includes a pin operably coupled to a spring wire, wherein the spring wire extends through an aperture in the pin.

13. The floor box cover as defined in claim 12, wherein the ends of the spring wire are retained in the frame and a medial portion of the spring wire is free to flex, the pin being disposed on the medial portion of the spring wire.

14. An electrical floor box cover comprising:
   a frame having a lower surface disposable on a flooring surface and an upper surface, the frame defining an access opening to permit access to an electrical box;
   a lid removably securable to the frame and movable between an open and closed position;
   a latch disposed on the frame and including an actuating member movable between a latched and unlatched position without the use of a tool; and
   a lid lifting device disposed adjacent the latch and between the lid and the frame, the lid lifting device including a driver movably retained in the frame and a biasing device acting to urge the driver toward the lid, the driver extending upwardly through an opening in the frame, the driver, under action of the biasing device, urging the lid away from the closed position when the actuating member is in the unlatched position.

15. The electrical floor box cover as defined in claim 14, wherein the lid lifting device lifts at least a portion of the lid above the frame to an initial open position when the latch is moved to the unlatched position, and wherein the lid covers the access opening when in the initial open position.

16. The electrical floor box cover as defined in claim 14, wherein the lid is securable to the frame in two orientations, in a first orientation the access opening is completely covered by the lid and in a second orientation a portion of the access opening is left uncovered by the lid.

17. The electrical floor box cover as defined in claim 14, wherein the lid includes a first and second opposed sides, and a first projection extends outwardly from the first side and a second projection extends outwardly from the second side, and the first projection is engagable with the latch when the actuating member is in the latched position to retain the lid in the closed position.

18. The electrical floor box cover as defined in claim 14, wherein the lid is secured to the frame by a flexible cord.

19. An electrical floor box cover comprising:
   a frame having a lower surface disposable on a flooring surface and an upper surface, the frame defining an access opening to permit access to an electrical box;
   a lid removably securable to the frame and movable between an open and closed position, the lid having a first lug extending from a first side and a lid securement device formed on a second lid side;
   a latch disposed on the frame and including an actuating member movable between a latched and unlatched position without the use of a tool, the first lug being engagable with the latch and the lid securement device being removably, engagable with the frame, wherein the lid is separable from the frame upon moving the actuating member to the unlatched position to fully expose the access opening; and
   a lid lifting device disposed adjacent the latch and between the lid and the frame, the lid lifting device including a driver movably retained in the frame and a biasing device acting to urge the driver toward the lid, the driver extending upwardly through an opening in the frame, the driver, under action of the biasing device, urging the lid away from the closed position when the actuating member is in the unlatched position.

20. The electrical floor box cover as defined in claim 19, wherein the securement device includes a second lug extending from the lid, the second lug being insertable in an indentation formed in the frame.

21. The electrical floor box cover as defined in claim 19, wherein the lid lifting device is disposed adjacent the latch.

22. The electrical floor box cover as defined in claim 19, wherein the driver extends through the frame and into engagement with the lid when the lid is in the closed position.

23. The electrical floor box cover as defined in claim 19, wherein the lid is securable to the frame in two orientations, in a first orientation the access opening is completely covered by the lid and in a second orientation a portion of the access opening is not covered by the lid.

* * * * *

UNITED STATES PATENT AND TRADEMARK OFFICE
CERTIFICATE OF CORRECTION

| | | |
|---|---|---|
| PATENT NO. | : 8,921,695 B2 | Page 1 of 1 |
| APPLICATION NO. | : 13/745530 | |
| DATED | : December 30, 2014 | |
| INVENTOR(S) | : Drane | |

It is certified that error appears in the above-identified patent and that said Letters Patent is hereby corrected as shown below:

In the claims

Column 10, line 17, claim 1

Now reads: "when the is in the"

Should read: -- when the lid is in the --

Signed and Sealed this
Sixteenth Day of February, 2016

Michelle K. Lee
*Director of the United States Patent and Trademark Office*